(12) United States Patent
Chen

(10) Patent No.: US 9,281,501 B2
(45) Date of Patent: Mar. 8, 2016

(54) LIGHT EXTRACTION FILM AND LIGHT EMITTING DEVICE USING THE SAME

(71) Applicant: AU Optronics Corp., Hsin-Chu (TW)

(72) Inventor: Chung-Chia Chen, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 569 days.

(21) Appl. No.: 13/665,926

(22) Filed: Oct. 31, 2012

(65) Prior Publication Data

US 2013/0155689 A1 Jun. 20, 2013

(30) Foreign Application Priority Data

Dec. 20, 2011 (TW) .............................. 100147625 A

(51) Int. Cl.
| | |
|---|---|
| *F21V 7/04* | (2006.01) |
| *H01L 51/52* | (2006.01) |
| *G02B 3/00* | (2006.01) |
| *G02B 5/02* | (2006.01) |
| *H01L 33/50* | (2010.01) |
| *H01L 33/58* | (2010.01) |

(52) U.S. Cl.
CPC .......... *H01L 51/5275* (2013.01); *G02B 3/0056* (2013.01); *G02B 5/0242* (2013.01); *G02B 5/0278* (2013.01); *H01L 51/5268* (2013.01); *G02B 2207/113* (2013.01); *H01L 33/507* (2013.01); *H01L 33/58* (2013.01); *H01L 2251/5369* (2013.01); *H01L 2933/0091* (2013.01)

(58) Field of Classification Search
CPC .... G02B 6/005; G02B 6/0051; G02B 6/0038; G02B 6/003; G02B 6/0025
USPC .................. 362/606–608, 615–620, 627–629
See application file for complete search history.

(56) References Cited

U.S. PATENT DOCUMENTS

| | | | | |
|---|---|---|---|---|
| 7,991,257 | B1 * | 8/2011 | Coleman | ...................... 362/97.1 |
| 2005/0057176 | A1 | 3/2005 | Lu et al. | |
| 2009/0115713 | A1 * | 5/2009 | Kakinuma et al. | .............. 345/88 |
| 2010/0164344 | A1 | 7/2010 | Boerner et al. | |
| 2011/0001159 | A1 | 1/2011 | Nakamura et al. | |

FOREIGN PATENT DOCUMENTS

| | | |
|---|---|---|
| CN | 102042565 A | 5/2011 |
| TW | I224297 | 11/2004 |
| TW | 200823557 | 6/2008 |
| TW | 200952539 | 12/2009 |

* cited by examiner

*Primary Examiner* — William Carter
(74) *Attorney, Agent, or Firm* — Winston Hsu; Scott Margo

(57) ABSTRACT

The present invention provides a light extraction film including a micro-lens array film and at least one optical film. The micro-lens array film has a first surface and a second surface opposite to each other, and has a plurality of micro-lenses disposed on the first surface. The optical film covers the first surface, and the optical film includes a plurality of optical particles and a thin film layer. The optical particles are disposed in the thin film layer.

18 Claims, 9 Drawing Sheets

LIGHT EXTRACTION FILM AND LIGHT EMITTING DEVICE USING THE SAME

BACKGROUND OF THE INVENTION

1. Field of the Invention

The present invention relates to a light extraction film and a light emitting device using the same, and more particularly, to a light extraction film with the integration of a micro-lens array (MLA) film and an optical film having scattering particles and a light emitting device using the same.

2. Description of the Prior Art

Organic light emitting device is a self emission device and has the properties of thin construction, low power consumption, fast response time and being flexible, thus it can be widely applied to illumination field.

With reference to FIG. 1, FIG. 1 is a schematic sectional view of a conventional organic light emitting device. As shown in FIG. 1, the conventional organic light emitting device 10 includes a transparent substrate 12, a transparent electrode layer 14, an organic light emitting layer 16 and a metal electrode 18. The transparent electrode layer 14 is disposed on the transparent substrate 12 and serves as the anode of the organic light emitting device 10. The organic light emitting layer 16 is disposed on the transparent electrode layer 14. The metal electrode 18 is disposed on the organic light emitting layer 16 for serving as the cathode of the organic light emitting device 10. The metal electrode 18 further serves as a reflection layer which reflects light toward the transparent substrate 12 to emit out from the device when the organic light emitting layer 16 generates light.

However, not all the light generated by the organic light emitting layer 16 can emit out from the transparent substrate 12. Generally, about 30 percent of the light generated by the organic light emitting layer 16 will be lost due to the surface plasmon resonance in the interface between the organic light emitting layer 16 and the metal electrode 18. In addition, the refractive indices of the organic light emitting layer 16 and the transparent electrode layer 14 are greater than that of the transparent substrate 12, such that the organic light emitting layer 16 and the transparent electrode layer 14 form an optical waveguide mode to confine the light to the organic light emitting layer 16 and the transparent electrode layer 14, causing a loss of about 30 percent of light. In addition, the refractive index of the transparent substrate 12 is greater than that of air that forms a substrate mode, thus total internal reflection easily occurs when light pass through the interface between the transparent substrate 12 and air, resulting in a loss of about 20 percent of light. As a result, only about 20 percent of light generated by a conventional organic light emitting layer 16 can be effectively utilized. If the light confined in the device can be extracted from the device, the light-emitting efficiency of the organic light emitting device will be effectively improved.

SUMMARY OF THE INVENTION

It is therefore one of the main objectives of the present invention to provide a light extraction film and a light emitting device using the same so as to improve the light-emitting efficiency of the light emitting device.

In order to achieve the above-mentioned objective, a light extraction film is provided according to the present invention. The light extraction film includes a Micro-Lenses Array (MLA) film and at least one optical film. The MLA film has a first surface and a second surface opposite to each other, and has a plurality of micro-lenses disposed on the first surface. The optical film covers the first surface and includes a plurality of optical particles and a thin film layer, wherein the optical particles are disposed in the thin film layer.

In order to achieve the above-mentioned objective, a light emitting device is further provided according to the present invention. The light emitting device includes a light source, a MLA film and at least one optical film. The light source has a light-emitting surface. The MLA film is disposed on the light-emitting surface of the light source and has a first surface and a second surface opposite to each other. The MLA film also has a plurality of micro-lenses disposed on the first surface, wherein the second surface contacts the light-emitting surface. The optical film covers the first surface and includes a plurality of optical particles and a thin film layer, and the optical particles are disposed in the thin film layer.

According to the present invention, the light extraction film is disposed on the light-emitting surface of the light source, and the MLA film is disposed between the optical film and the light source. When light penetrate toward the optical film, the light confined by the substrate mode can be first extracted by the MLA film and then be scattered through the optical film. Accordingly, the light emitting device of the present invention has preferable light energy gain and preferable color stability over viewing angle, and has a more uniform distribution of light in the viewing angle range from 0 degree)(°) to 90°.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate the contents and effects to be achieved.

Figure 1:
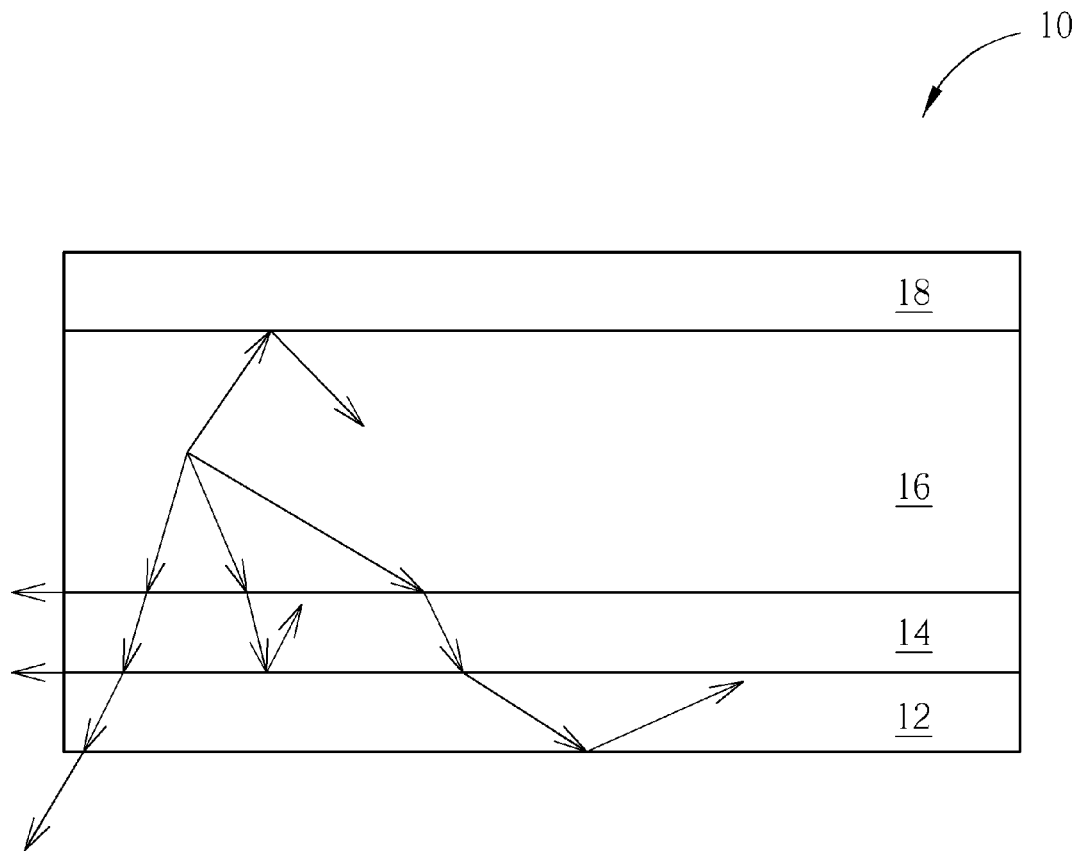
FIG. 1 is a schematic sectional view illustrating a conventional organic light emitting device.
Figure 2:
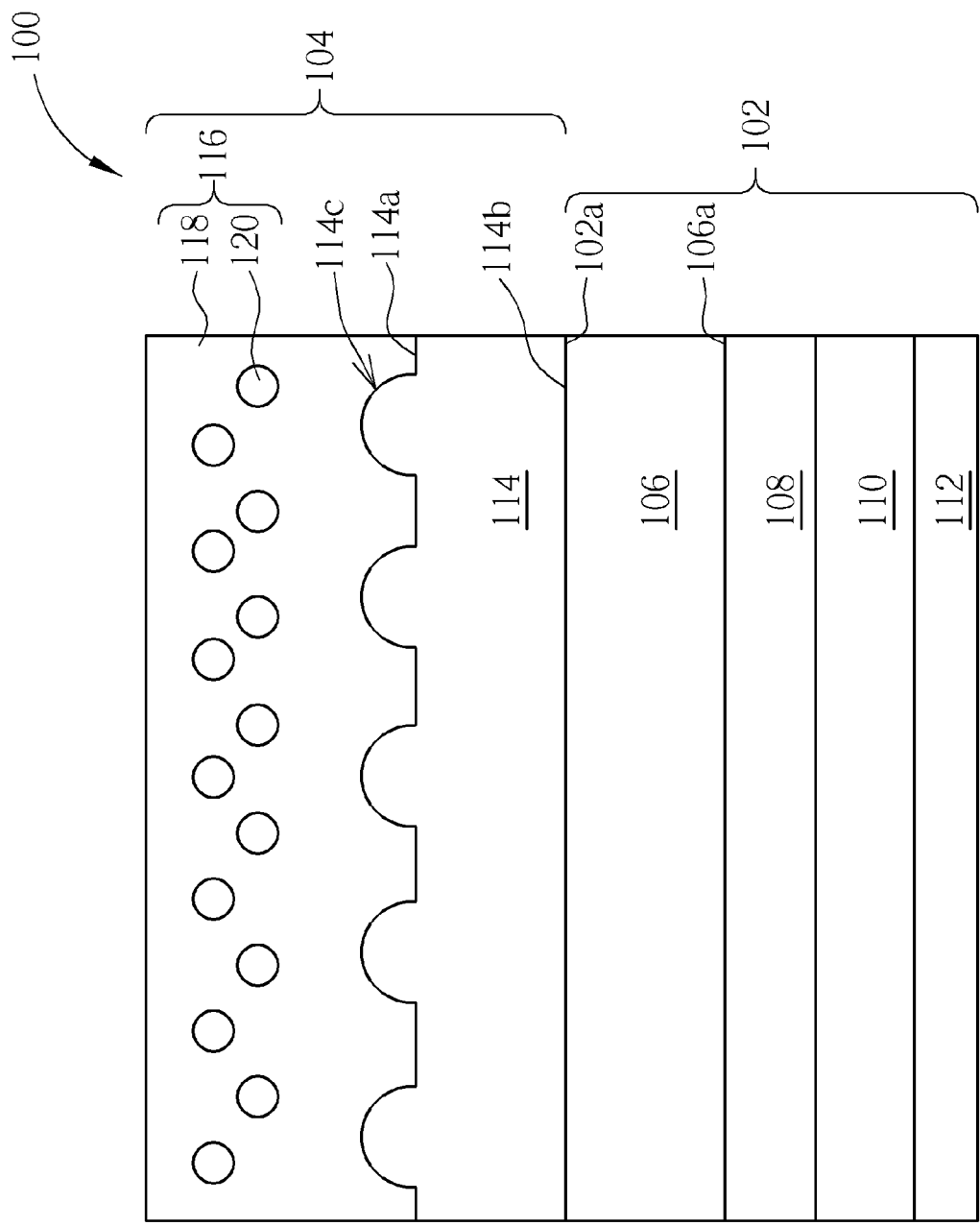
FIG. 2 is a schematic sectional view illustrating a light emitting device according to a first preferred embodiment of the present invention.

With reference to FIG. 2, FIG. 2 is a schematic sectional view illustrating a light emitting device according to a first preferred embodiment of the present invention. As shown in FIG. 2, the light emitting device 100 includes a light source 102 and a light extraction film 104. In this embodiment, the light source 102 is an organic light-emitting diode (OLED) and includes a transparent substrate 106, a first electrode layer 108, an organic light emitting layer 110 and a second electrode layer 112. Wherein, the transparent substrate 106 has a light-exiting surface and a light-entering surface 106a, and the first electrode layer 108, the organic light emitting layer 110 and the second electrode layer 112 are sequentially stacked on the light-entering surface 106a of the transparent substrate 106. The transparent substrate 106 may be composed of transparent material of polystyrene (PS), polyvinyl chloride (PVC), polyethylene terephthalate (PET), polymethylmethacrylate (PMMA), or glass for example, but not limited thereto. The transparent substrate 106 has a fourth refractive index of 1.6 for instance. The first electrode layer 108 is composed of a transparent conductive material with high work function, such as indium tin oxide (ITO) or indium zinc oxide (IZO), and may serve as the anode of the OLED. The second electrode layer 112 may be composed of a reflective conductive material with low work function, such as calcium, aluminum, silver or magnesium, and may serve as the cathode of the OLED. Therefore, the light generated by the organic light emitting layer 110 may emit out through the transparent substrate 106 so that the light source 102 has a light-emitting surface 102a, which is the light-exiting surface of the transparent substrate 106. The light extraction film 104 is disposed on the light-emitting surface 102a of the light source 102 and directly contacts the light source 102. The light source of the present invention is not limited to OLED, and may be other types of light sources, such as light-emitting diode.

In addition, the light extraction film 104 of this embodiment includes a Micro-Lenses Array (MLA) film 114 and an optical film 116. The MLA film 114 is disposed on the light-emitting surface 102a of the light source 102, and has a first surface 114a and a second surface 114b opposite to each other. The MLA film 114 has a plurality of micro-lenses 114c disposed on the first surface 114a. The second surface 114b of the MLA film 114 directly contacts the light-emitting surface 102a of the light source 102. Furthermore, each of the micro-lenses 114c may have a hemispherical shape, a camber shape or an ellipsoid shape. Therefore, the MLA film 114 can extract light to enable light to enter the optical film 116. However, each of the micro-lenses 114c of the present invention is not limited to the above-mentioned shapes. The MLA film 114 has a first refractive index of 1.5 for example. In order to avoid total internal reflection when light penetrate from the transparent substrate 106 to the MLA film 114, the first refractive index of the MLA film 114 is preferably greater than or equal to the fourth refractive index of the transparent substrate 106, so as to raise the light extraction efficiency. The MLA film 114 may be composed of a transparent material, such as silicone, silica, PS, PVC, PET or PMMA, but not limited thereto.

In addition, the optical film 116 covers the first surface 114a of the MLA film 114 and includes a thin film layer 118 and a plurality of optical particles 120. The thin film layer 118 has a second refractive index of 1.48 for example, less than the first refractive index and greater than the refractive index of air, and the second refractive index is preferably near to the refractive index of air, so as to reduce the proportion of occurring total internal reflection when light penetrate into the air from the optical film 116. The thin film layer 118 may be composed of a material such as PET, polyethylene naphthalate (PEN), polycarbonate (PC), PMMA, polyimide (PI) or silicon-based material, such as polysinoxanes, but not limited thereto. Furthermore, the optical particles 120 are disposed in the thin film layer 118 and distributed in the thin film layer 118, for scattering the light passing through the optical film 116 to further uniform the light emitting out from the optical film 116. It is noteworthy that each of the optical particles 120 has the size of nanometer scale, which means it has a particle diameter substantially between 200 nanometers (nm) and 500 nm. Under the situation of that the light is visible light, it is easily that light diffuses back and forth between the particles to cause energy consumption of light by absorption of the film if the particle diameter of the optical particles 120 is much greater than the wavelength of visible light. Therefore, according to this embodiment, the particle diameter of the optical particles 120 and the wavelength of light have the same scale so as to avoid consumption of light and effectively scatter visible light. In this embodiment, each of the optical particles 120 is respectively a scattering particle and has a third refractive index, such as 2 for example, greater than the second refractive index of the thin film layer 118, in order to effectively scatter light. Detailedly, as long as the difference value between the second refractive index and the third refractive index ($\Delta n$) is substantially greater than 0.2, the optical film 116 could provide a good scattering performance even if the second refractive index is greater than the third refractive index. The optical particles 120 may include a transparent material of titanium dioxide ($TiO_2$), zirconia ($ZrO_2$) or aluminum oxide, but not limited thereto. It should be noted that the light extraction film 104 of this embodiment adopts the MLA film 114 to collect the light emitted from the light source 102 first and then scatters the light through the optical film 116, such that the light emitting device 100 of this embodiment generates light with high brightness and high uniformity.

Figure 3:
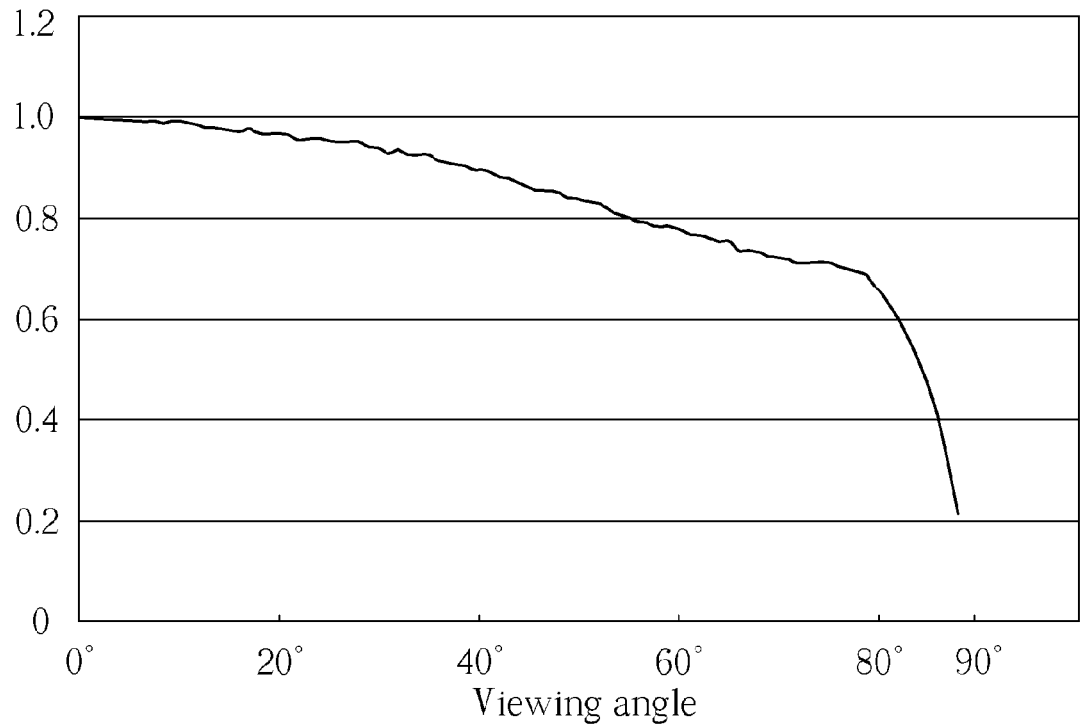
FIG. 3 is a schematic diagram of the relative curve of the comparative light brightness versus viewing angle of the light emitting device of type 1.
Figure 4:
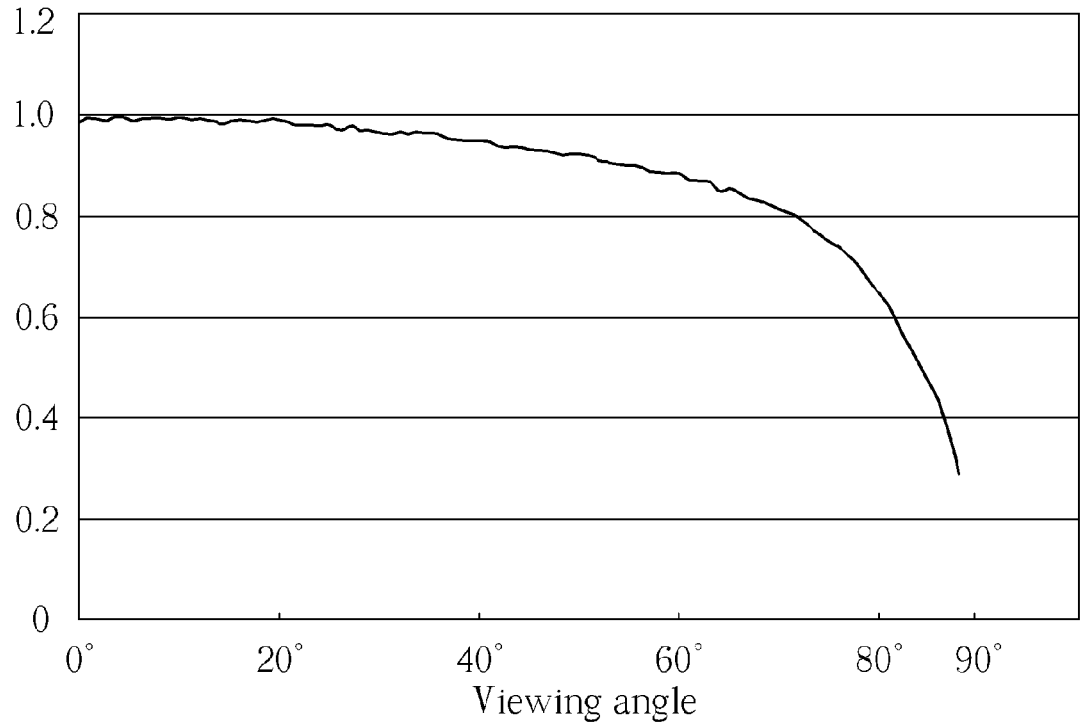
FIG. 4 is a schematic diagram of the relative curve of the comparative light brightness versus viewing angle of the light emitting device of type 2.
Figure 5:
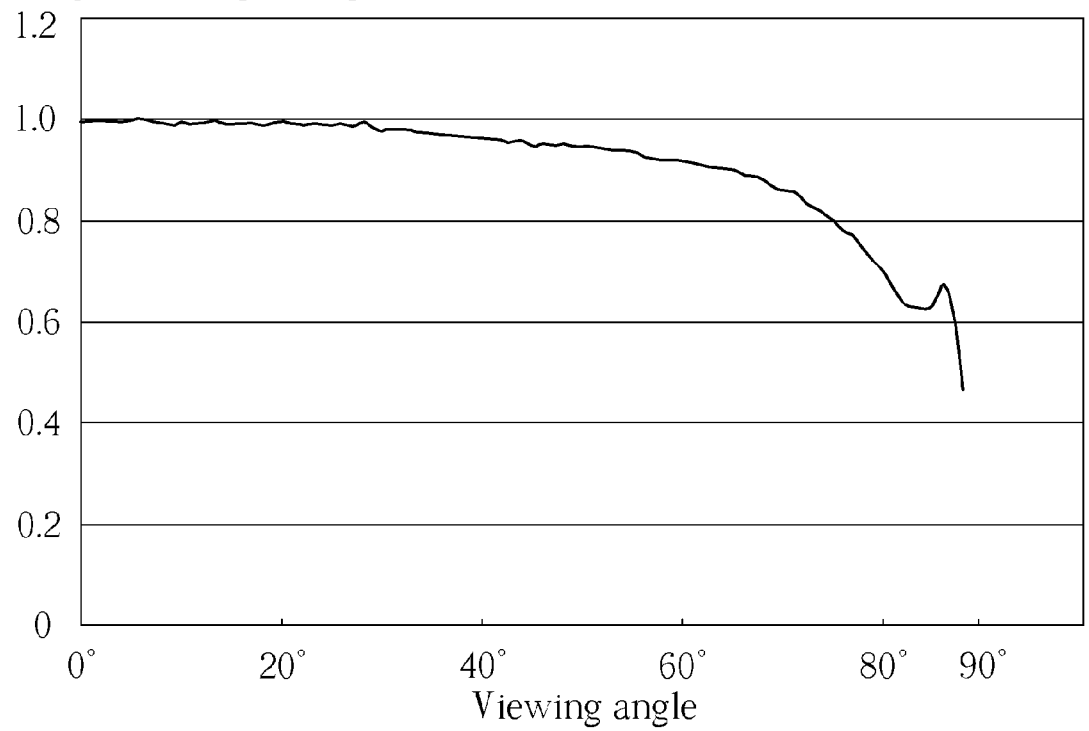
FIG. 5 is a schematic diagram of the relative curve of the comparative light brightness versus viewing angle of the light emitting device of type 3.
Figure 6:
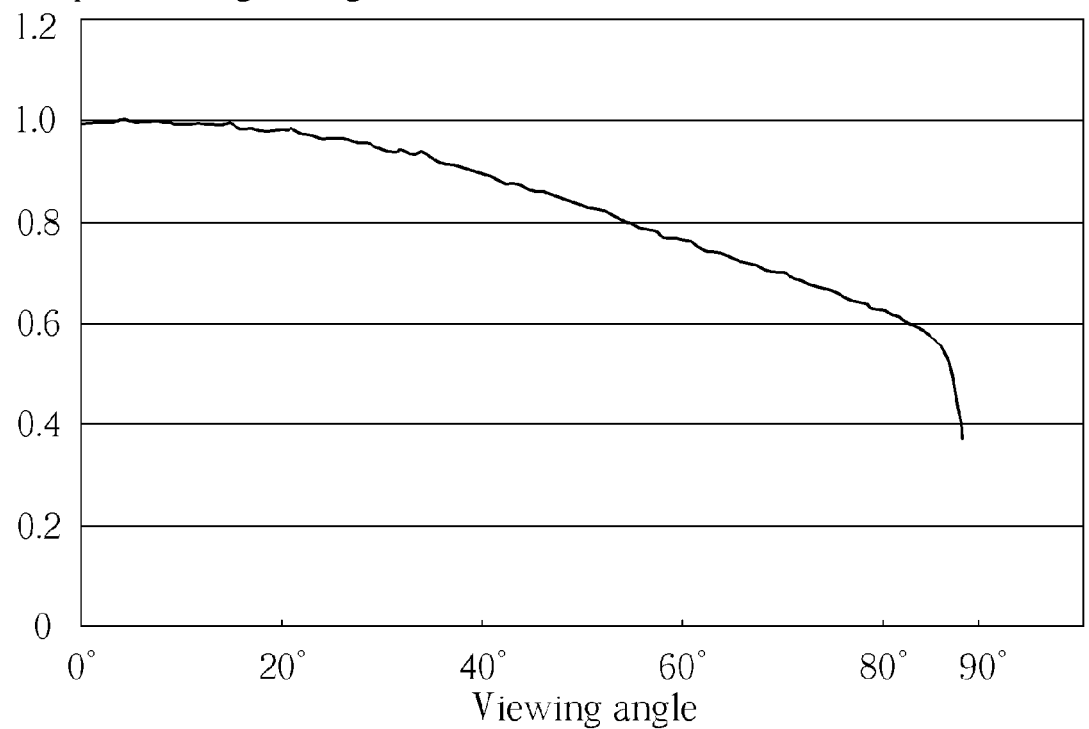
FIG. 6 is a schematic diagram of the relative curve of the comparative light brightness versus viewing angle of the light emitting device of type 4.

The effect of the light emitting device of this embodiment is further described thereinafter. Please refer to Table 1 and FIG. 3 to FIG. 6. In Table 1, type 1 means a light emitting device composed of only a light source; type 2 means a light emitting device composed of a light source and an optical film disposed on the light-emitting surface of the light source; type 3 means a light emitting device composed of a light source and a light extraction film of this embodiment; and type 4 means a light emitting device composed of only a light source and an MLA film disposed on the light-emitting surface of the light source. FIG. 3 is a schematic diagram of the relative curve of the comparative light brightness versus viewing angle of the light emitting device of type 1 in Table 1; FIG. 4 is a schematic diagram of the relative curve of the comparative light brightness versus viewing angle of the light emitting device of type 2 in Table 1; FIG. 5 is a schematic diagram of the relative curve of the comparative light brightness versus viewing angle of the light emitting device of type 3 in Table 1; and FIG. 6 is a schematic diagram of the relative curve of the comparative light brightness versus viewing angle of the light emitting device of type 4 in Table 1. The light energy gain means the ratio of the light energy generated by each type of the light emitting devices measured by integrating sphere and that of the light emitting device of type 1. The greater the ratio value is, the better the light energy gain is. The coordinate distance of the viewing angles of 0° and 60° means the distance difference value between the coordinates in the CIE-LUV color space of the observed colors in the viewing angle of 0° and in the viewing angle of 60° of each type of the light emitting device. The less the difference is, the less the color shift is, and vice versa. As shown in Table 1 and FIG. 3 to FIG. 6, comparing the light generated by the light emitting device of type 1 with those of type 2, type 3 and type 4, although the optical film of type 2 can scatter light to provide a preferable color stability over viewing angle and a more uniform light distribution of light in the viewing angle range of from 0° to 90°, the light energy gain of type 2 is less than those of the light emitting devices of type 3 and type 4 of this embodiment. In addition, although the MLA film of type 4 can improve the light energy gain to provide a preferable light energy gain, the color shift in different viewing angles of the light color of type 4 is greater than that of type 1 and the light distribution in the viewing angle range of from 0° to 90° of type 4 is less uniform. The light emitting device of type 3 representing this embodiment uses the light extraction film including a MLA film and an optical film disposed on the MLA film to collect the light emitted from the light source and then scatter the light, thus the light emitting device of this embodiment has a preferable light energy gain, a preferable color stability over viewing angle and a more uniform light distribution in the viewing angle range of from 0° to 90°, in comparison with type 1.

TABLE 1

|  | Type of light emitting device | | | |
| --- | --- | --- | --- | --- |
|  | Type 1 | Type 2 | Type 3 | Type 4 |
| Light energy gain | 1 | 1.48 | 1.55 | 1.58 |
| Coordinate distance of the viewing angle of 0° and 60° in CIELUV color space | 0.042 | 0.003 | 0.015 | 0.046 |

The light extraction film of the present invention is not limited by the aforementioned embodiment and may have other different preferred or variant embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 7:
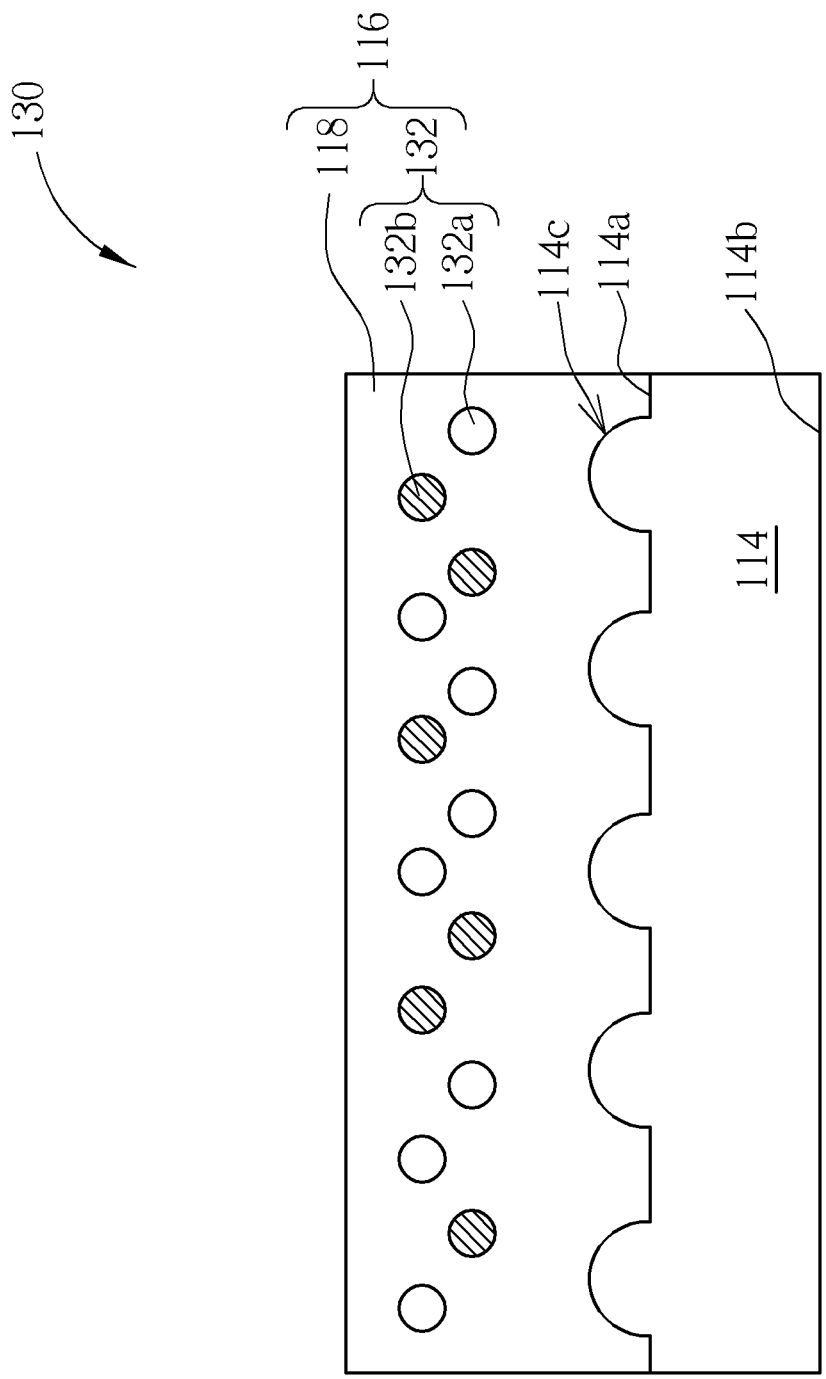
FIG. 7 is a schematic sectional view illustrating a light extraction film according to a second preferred embodiment of the present invention.

With reference to FIG. 7, FIG. 7 is a schematic sectional view illustrating a light extraction film according to a second preferred embodiment of the present invention. As shown in FIG. 7, in comparison with the first embodiment, the optical particles 132 of the light extraction film 130 of this embodiment include a plurality of scattering particles 132a and a plurality of fluorescent particles 132b, and the scattering particles 132a and the fluorescent particles 132b are disposed in the thin film layer 116. More specifically, a part of the optical particles 132 of this embodiment are fluorescent particles 132b, and the other part of the optical particles 132 are still scattering particles 132a. Wherein, the fluorescent particles 132b are used to convert the light color of the light generated by the light source to another color. For example, when the fluorescent particles 132b are composed of yttrium aluminum garnet (YAG), they convert the light generated by the light source to yellow light, or when the fluorescent particles 132b are composed of nitride, they convert the light generated by the light source to red light. However, the fluorescent particles 132b of the present invention are not limited to the above-mentioned materials.

Figure 8:
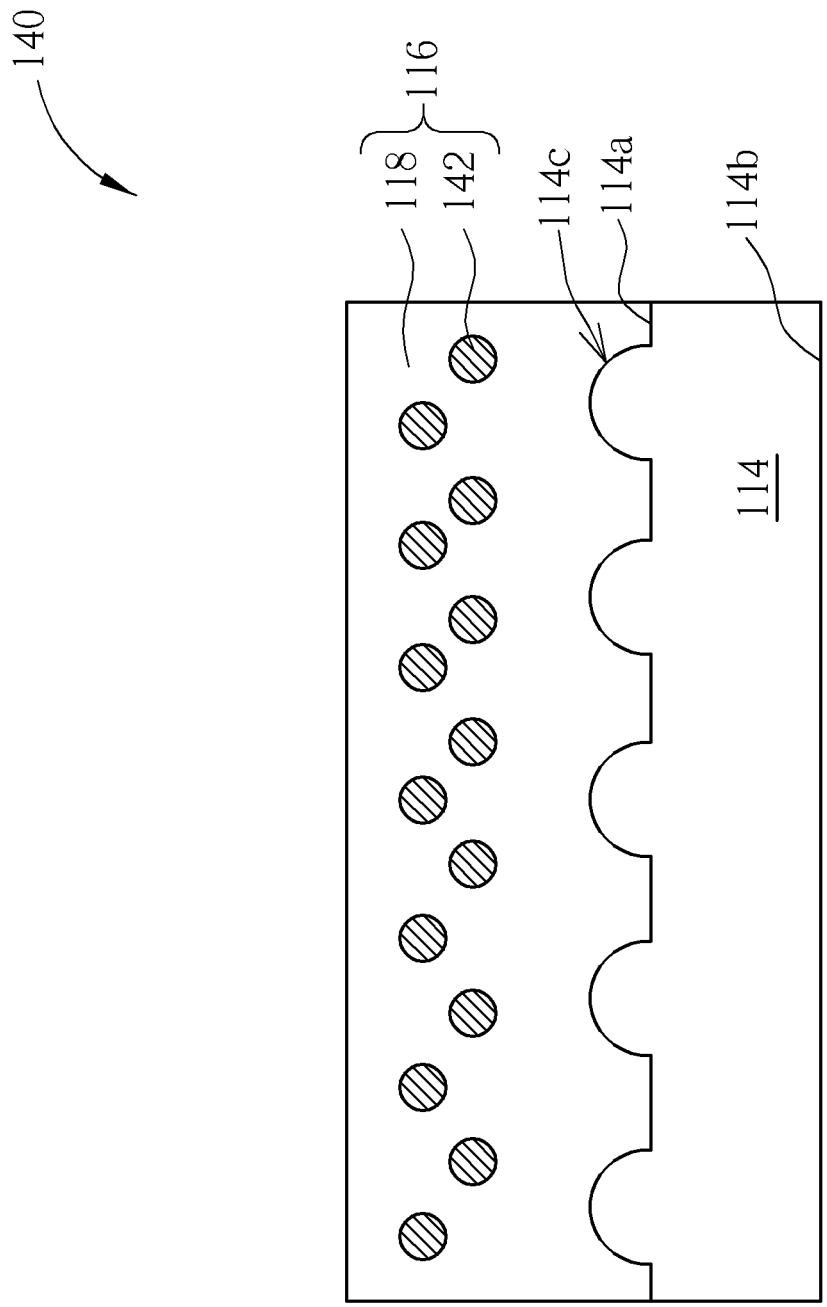
FIG. 8 is a schematic sectional view illustrating a light extraction film according to a third preferred embodiment of the present invention.

With reference to FIG. 8, FIG. 8 is a schematic sectional view illustrating a light extraction film according to a third preferred embodiment of the present invention. As shown in FIG. 8, in comparison with the first embodiment, each of the optical particles of the light extraction film 140 of this embodiment is respectively a fluorescent particle 142, for converting the light generated by the light source to different light color. For example, when the fluorescent particles 132b are composed of YAG, they convert the light generated by the light source to yellow light, or when the fluorescent particles 132b are composed of nitride, they convert the light generated by the light source to red light. However, the fluorescent particles 132b of the present invention are not limited to the above-mentioned materials.

Figure 9:
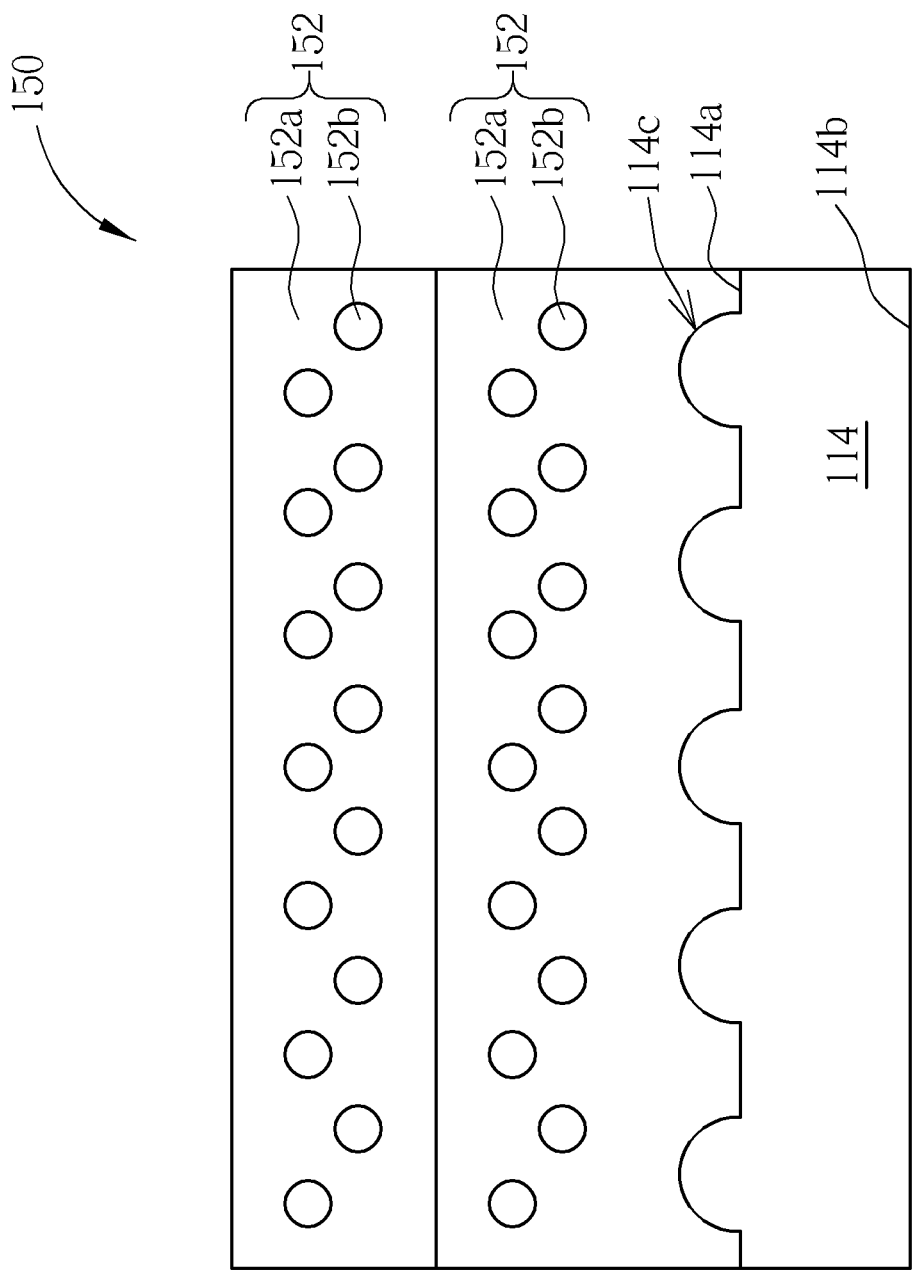
FIG. 9 is a schematic sectional view illustrating a light extraction film according to a fourth preferred embodiment of the present invention.

With reference to FIG. 9, FIG. 9 is a schematic sectional view illustrating a light extraction film according to a fourth preferred embodiment of the present invention. As shown in FIG. 9, in comparison with the first embodiment, the light extraction film 150 of this embodiment includes a plurality of layers of optical films 152, which are sequentially stacked on the first surface 114a of the MLA film 114, and each of the optical films 152 respectively has a thin film layer 152a and a plurality of optical particles 152b. The refractive index of the thin film layer 152a of one of the optical films 152 near the MLA film 114 is greater than the refractive index of the thin film layer 152a of one of the optical films 152 distant from the MLA film 114. In other words, the nearer the thin film layer 152a of the optical films 152 to the MLA film 114 is, the greater its refractive index is. In this embodiment of the present invention, each optical particle 152b of each of the optical films 152 is respectively a scattering particle, but not limited thereto.

Figure 10:
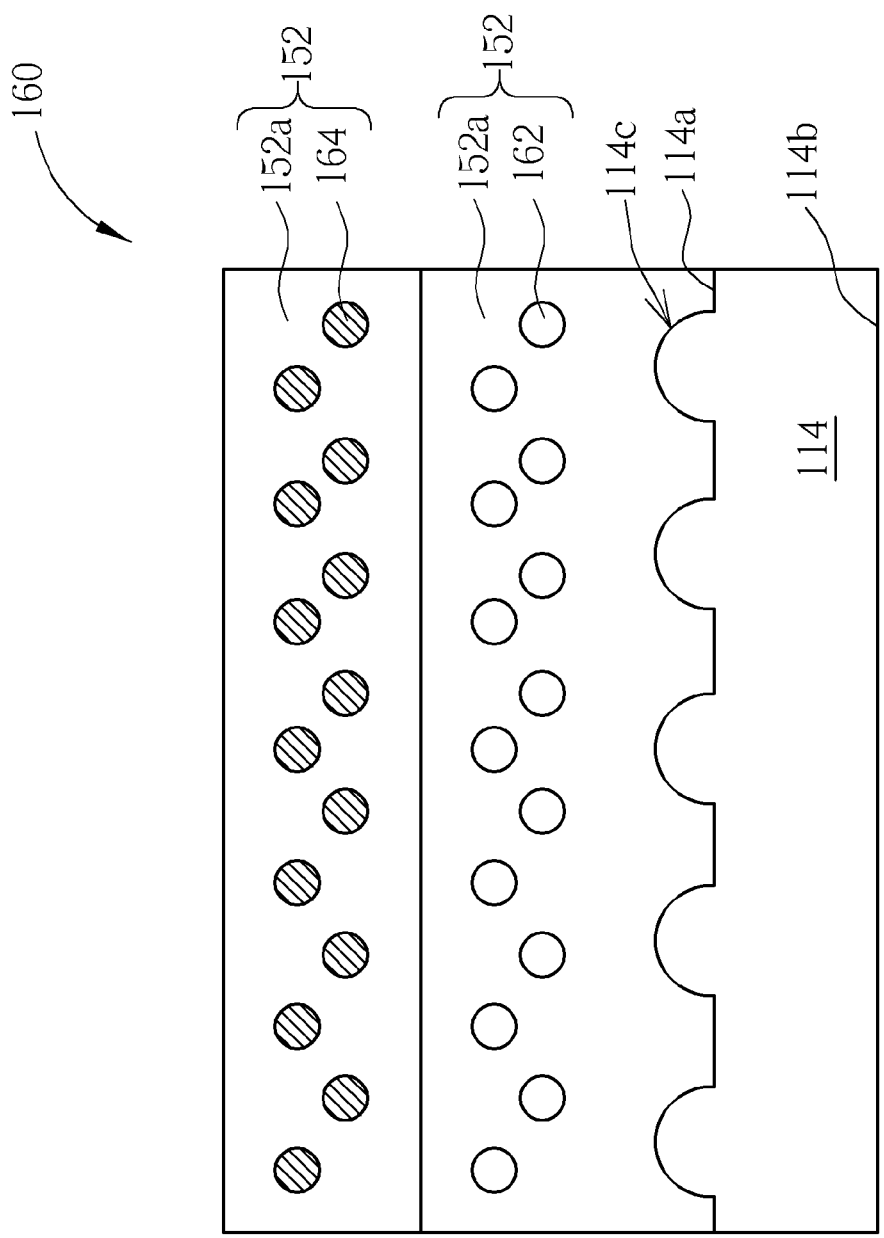
FIG. 10 is a schematic sectional view illustrating a light extraction film according to a fifth preferred embodiment of the present invention.

With reference to FIG. 10, FIG. 10 is a schematic sectional view illustrating a light extraction film according to a fifth preferred embodiment of the present invention. As shown in FIG. 10, in comparison with the fourth embodiment, in the light extraction film 160 of this embodiment, each of the optical particles of one of the optical films 152 is respectively a scattering particle 162, and each of the optical particles of another one of the optical films 152 is respectively a fluorescent particle 164. Accordingly, when light penetrates the optical film 152, it will be scattered by the optical film 152 with scattering particles 162 and also can be converted to other color by the optical film 152 with fluorescent particles 164. Moreover, since the energy conversion efficiency of color-converting of the fluorescent particles 164 is not 100%, the optical film 152 having optical particles of scattering particles 162 is preferable disposed between the optical film 152 having optical particles of fluorescent particles 164 and the MLA film 114 according to this embodiment, which means the optical film 152 having the optical particles of fluorescent particles 164 is at the most outer side. Therefore, the light extracted by the MLA film 114 will be first scattered by the scattering particles 162 and then be converted to other color by the fluorescent particles 164 so as to provide more uniform light distribution.

Figure 11:
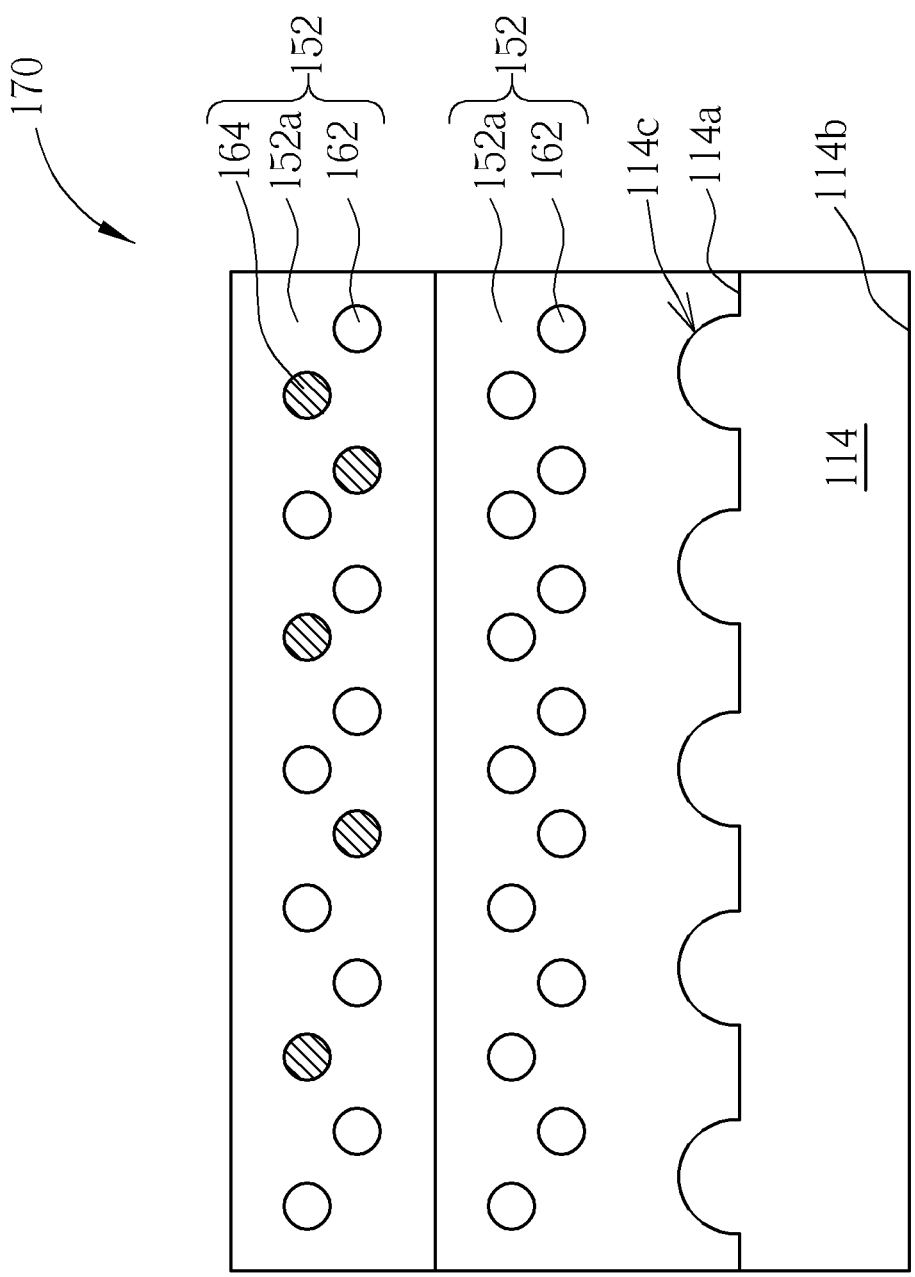
FIG. 11 is a schematic sectional view illustrating a light extraction film according to a sixth preferred embodiment of the present invention.

With reference to FIG. 11, FIG. 11 is a schematic sectional view illustrating a light extraction film according to a sixth preferred embodiment of the present invention. As shown in FIG. 11, in comparison with the fifth embodiment, each optical particle of one of the optical films 152 in the light extraction film 170 of this embodiment is respectively a scattering particle 162, and the optical particles of another one of the optical films 152 include scattering particles 162 and fluorescent particles 164. In addition, the optical film 152 with only scattering particles 162 is disposed between the optical film 152 with scattering particles 162 and fluorescent particles 164 and the MLA film 114, so as to provide a more uniform light distribution.

In conclusion, according to the present invention, the light extraction film is disposed on the light-emitting surface of the light source, and the MLA film is disposed between the optical film and the light source. When light penetrate toward the optical film, the MLA film first extracts the light confined in the substrate mode, and then the extracted light is scattered by the optical film. Accordingly, the light generated by the light emitting device of the present invention has preferable light energy gain and preferable color stability over viewing angle, and has more uniform light distribution in the viewing angles of range from 0° to 90°.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light emitting device, comprising:
   a light source, having a light-emitting surface, wherein the light source includes a transparent substrate, a first electrode layer, an organic light emitting layer and a second electrode layer, the transparent substrate has a light-exiting surface and a light-entering surface, the first electrode layer, the organic light emitting layer and the second electrode layer are sequentially stacked on the light-entering surface of the transparent substrate, and the light-emitting surface of the light source is the light-exiting surface of the transparent substrate;
   a MLA film, disposed on the light-emitting surface of the light source, the MLA film having a first surface and a second surface opposite to each other and having a plurality of micro-lenses disposed on the first surface, wherein the second surface directly contacts the light-emitting surface; and
   at least one optical film covering the first surface, the optical film comprising a plurality of optical particles and a thin film layer, and the optical particles being evenly distributed throughout the entire thin film layer, wherein the thin film layer covers the first surface.

2. The light emitting device of claim 1, wherein the optical particles comprising a plurality of scattering particles and a plurality of fluorescent particles.

3. The light emitting device of claim 1, wherein each of the optical particles is a scattering particle or a fluorescent particle respectively.

4. The light emitting device of claim 1, wherein the MLA film has a first refractive index, the thin film layer has a second refractive index, and the second refractive index is less than the first refractive index and greater than a refractive index of air.

5. The light emitting device of claim 4, wherein each of the optical particles has a third refractive index, and the third refractive index is greater than the second refractive index.

6. The light emitting device of claim 1, wherein the at least one optical film comprises a plurality of optical films.

7. The light emitting device of claim 6, wherein the optical films are sequentially stacked on the MLA film, and a refractive index of the thin film layer of one of the optical films near the MLA film is greater than a refractive index of the thin film layer of another one of the optical films distant from the MLA film.

8. The light emitting device of claim 6, wherein each of the optical particles of one of the optical films is a scattering particle respectively, and each of the optical particles of another one of the optical films is a fluorescent particle respectively.

9. The light emitting device of claim 6, wherein each of the optical particles of one of the optical films is a scattering particle respectively, and the optical particles of another one of the optical films comprise a plurality of scattering particles and a plurality of fluorescent particles.

10. A light emitting device, comprising:
    a light source, having a light-emitting surface, wherein the light source includes a transparent substrate, a first electrode layer, an organic light emitting layer and a second electrode layer, the transparent substrate has a light-exiting surface and a light-entering surface, the first electrode layer, the organic light emitting layer and the second electrode layer are sequentially stacked on the light-entering surface of the transparent substrate, and a light-emitting surface of the light source is the light-exiting surface of the transparent substrate;
    a MLA film, disposed on the light-emitting surface of the light source, the MLA film having a first surface and a second surface opposite to each other and having a plurality of micro-lenses disposed on the first surface, wherein the second surface directly contacts the light-emitting surface; and
    at least one optical film covering the first surface, the optical film comprising a plurality of optical particles and a thin film layer, and the optical particles being distributed in the thin film layer, wherein the thin film layer covers the first surface.

11. The light emitting device of claim 10, wherein the optical particles comprising a plurality of scattering particles and a plurality of fluorescent particles.

12. The light emitting device of claim 10, wherein each of the optical particles is a scattering particle or a fluorescent particle respectively.

13. The light emitting device of claim 10, wherein the MLA film has a first refractive index, the thin film layer has a second refractive index, and the second refractive index is less than the first refractive index and greater than a refractive index of air.

14. The light emitting device of claim 13, wherein each of the optical particles has a third refractive index, and the third refractive index is greater than the second refractive index.

15. The light emitting device of claim 10, wherein the at least one optical film comprises a plurality of optical films.

16. The light emitting device of claim 15, wherein the optical films are sequentially stacked on the MLA film, and a refractive index of the thin film layer of one of the optical films near the MLA film is greater than a refractive index of the thin film layer of another one of the optical films distant from the MLA film.

17. The light emitting device of claim 15, wherein each of the optical particles of one of the optical films is a scattering particle respectively, and each of the optical particles of another one of the optical films is a fluorescent particle respectively.

18. The light emitting device of claim 15, wherein each of the optical particles of one of the optical films is a scattering particle respectively, and the optical particles of another one of the optical films comprise a plurality of scattering particles and a plurality of fluorescent particles.

* * * * *